365-182 AU 233 EX
1/21/86 OR RE 32,071

United States Patent [19]

Bertin

[11] E Patent Number: Re. 32,071

[45] Reissued Date of Patent: Jan. 21, 1986

[54] RESISTIVE GATE FET FLIP-FLOP STORAGE CELL

[75] Inventor: Claude L. Bertin, South Burlington, Vt.

[73] Assignee: International Business Machines Corporation, Armonk, N.Y.

[21] Appl. No.: 238,382

[22] Filed: Feb. 25, 1981

Related U.S. Patent Documents

Reissue of:

[64] Patent No.: 4,158,239
Issued: Jun. 12, 1979
Appl. No.: 862,476
Filed: Dec. 20, 1977

[51] Int. Cl.[4] ..... G11C 11/40

[52] U.S. Cl. ..... 365/182; 365/174; 365/184

[58] Field of Search ..... 357/23 MG; 365/154, 365/155, 156, 174

[56] References Cited

U.S. PATENT DOCUMENTS

| | | | |
|---|---|---|---|
| 3,714,522 | 1/1973 | Komiya et al. | 317/235 |
| 3,943,286 | 3/1976 | Tsurushima | 179/1 GQ |
| 4,025,940 | 5/1977 | Kimura et al. | 357/23 |
| 4,092,735 | 5/1978 | McElroy | 365/183 |
| 4,157,557 | 6/1979 | Sato et al. | 357/23 |

FOREIGN PATENT DOCUMENTS 2250613 4/1974 Fed. Rep. of Germany .

OTHER PUBLICATIONS

*IEEE Transactions on Electron Devices* "A Resistive--Gated IGFET Tetrode" by C. Hu et al., Jul. 1971, pp. 418–425.

*Primary Examiner*—Terrell W. Fears
*Attorney, Agent, or Firm*—John E. Hoel

[57] ABSTRACT

An improved bistable FET circuit is disclosed which employs a reduced number of device elements and occupies less space in an integrated circuit. The flip-flop circuit includes the FET device having its source connected to a first potential and a second FET device having its source also connected to the first potential. The first FET device has a gate electrode composed of a resistive material with the first side connected to the drain of the second FET device and the second side connected to a second potential. The second FET device has a gate electrode comprised of a resistive material with the first side connected to the drain of the first FET device and a second side connected to the second potential. In this manner, the resistive gate of the first device serves as the load for the second device and the resistive gate of the second device serves as the load for the first device. Application of this circuit to electrically programmable PLA's and to random access memories is disclosed.

11 Claims, 14 Drawing Figures

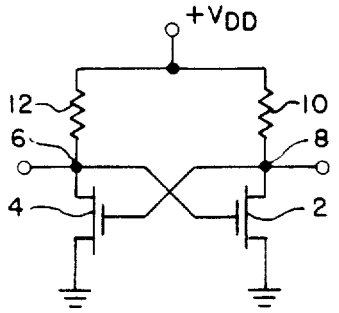
PRIOR ART FIG. 1
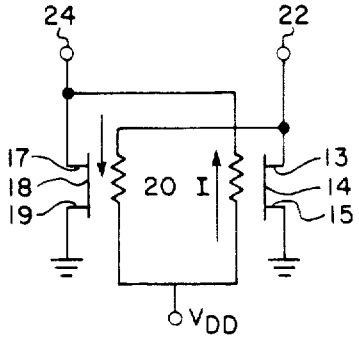
FIG. 2
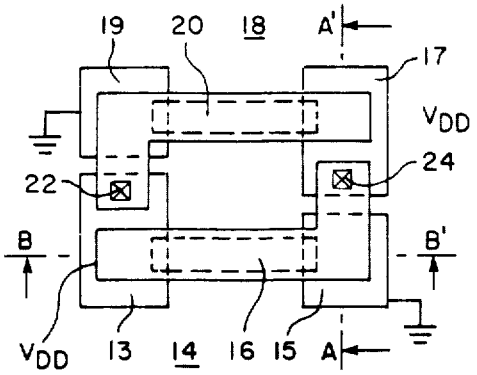
FIG. 3a
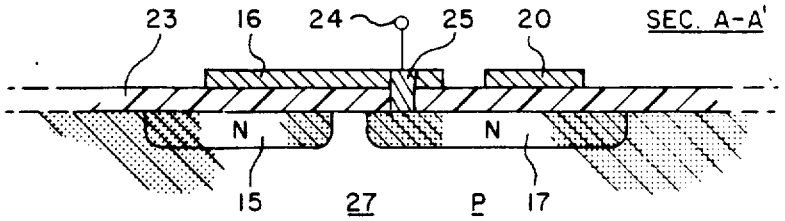
FIG. 3b
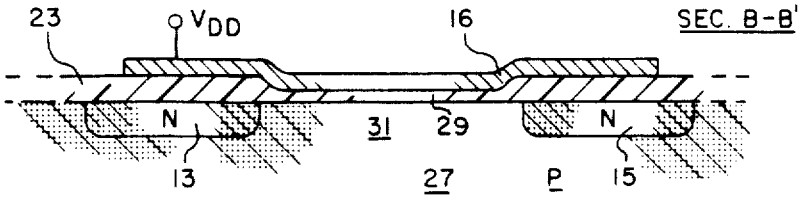
FIG. 3c

RESISTIVE GATE FET FLIP-FLOP STORAGE CELL

Matter enclosed in heavy brackets [ ] appears in the original patent but forms no part of this reissue specification; matter printed in italics indicates the additions made by reissue.

FIELD OF THE INVENTION

The invention disclosed broadly relates to field effect transistor circuits, and, more particularly, relates to bistable FET circuits.

BACKGROUND OF THE INVENTION

Bistable circuits, generally known as flip-flop circuits, have been present in the prior art since the days of the vacuum tube and relay. The flip-flop circuits have two stable states and two input terminals or types of input signals, each of which corresponds with one of the two states. The circuit remains in either state until called upon to change to the other state by the application of the corresponding signal. The conventional flip-flop circuit uses two active devices with positive feedback in such a way that the two devices tend towards opposite states, one "off" and one "on".

The flip-flop or bistable multivibrator is characterized by its ability to maintain either of two possible states. It is widely used in counting circuits, shift registers, and memory circuits. FIG. 1 shows a conventional flip-flop circuit which employs active FET devices 2 and 4 which have their gates cross-coupled to the corresponding nodes 6 and 8, which are, in turn, connected through load devices 10 and 12 to the drain potential VDD. FET device 2 is turned on by a positive potential on the node 6 and open the current path through the resistive load 10 between VDD and ground, causing the node 8 potential to drop. Since node 8 is connected to the gate of FET 4, FET 4 is turned off, stopping the current flow through the load device 12, thereby causing the potential of node 6 to rise. The rise in the potential of node 6, which is transferred to the gate of FET device 2 sustains the on-state of FET device 2, thereby making that state stable. The state of the flip-flop circuit of FIG. 1 is reversed by placing an "on" signal at node 8 which turns FET device 4 on, increasing the current flow through the load device 12, thereby reducing the potential at node 6, which in turn, reduces the potential on the gate of FET device 2, thereby turning it off. With FET device 2 off, current through the load device 10 is stopped and node 8 rises, causing the gate of FET device 4 to turn that device on, thereby sustaining the "on" state of FET device 4, so that the flip-flop circuit of FIG. 1 remains in its second stable state.

Many types of load devices 10 and 12 have been employed, such as simple diffusion resistors, self biased enhancement mode or depletion mode FET devices, and layers of polycrystalline silicon material lying on top of the passivation layer for the integrated circuit. Since flip-flop circuits, such as shown in FIG. 1, are used in large quantities for information storage applications, the area occupied by that circuit on the LSI chip strongly governs the information storage density which can be achieved. Any net reduction which can be achieved in the packing density for flip-flop circuitry will yield a direct economic benefit in the quantity of information which can be stored on an LSI chip for a particular application.

OBJECTS OF THE INVENTION

It is therefore an object of the invention to increase the circuit packing density for storage circuits in a large scale integrated chip.

It is still another object of the invention to reduce the number of circuit elements for storage circuits employed in a semiconductor memory.

SUMMARY OF THE INVENTION

These and other objects, features, and advantages of the invention are accomplished by the flip-flop with resistive gate field effect transistors, disclosed herein.

An improved bistable FET circuit is disclosed which employs a reduced number of device elements and occupies less space in an integrated circuit. The flip-flop circuit includes the FET device having its source connected to a first potential and a second FET device having its source also connected to the first potential. The first FET device has a gate electrode composed of a resistive material with the first side connected to the drain of the second FET device and the second side connected to a second potential. The second FET device has a gate electrode comprised of a resistive material with the first side connected to the drain of the first FET device and a second side connected to the second potential. In this manner, the resistive gate of the first device serves as the loaf for the second device and the resistive gate of the second device serves as the load for the first device. Application of this circuit to electrically programmable PLA's and to random access memories is disclosed.

DESCRIPTION OF THE FIGURES

These and other objects, features and advantages of the invention can be more fully appreciated with reference to the accompanying figures.

FIG. 1 is a schematic diagram of the prior art FET flip-flop circuit.

FIG. 2 is a schematic circuit of the flip-flop circuit using resistsive gate field effect transistors, in accordance with the invention.

FIG. 3a is a plan view of the layout of the flip-flop with resistive gate field effect transistors for the schematic diagram of FIG. 2. FIGS. 3b and 3c show sections of same.

FIG. 5b is a cross-sectional view along the section line A—A' of FIG. 5a.

FIG. 5c is as cross-sectional view along the section line B—B' of FIG. 5a.

DISCUSSION OF THE PREFERRED EMBODIMENT

Figure 4A:
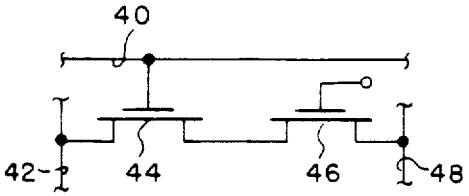
FIG. 4a is circuit schematic of an AND FET device in an alterable PLA.

The circuit schematic of FIG. 2 illustrates the flip-flop circuit employing resistive gate FET devices, in accordance with the invention. Field effect transistor device 14 is connected with its source to ground potential and its drain to the first output mode 22. The field effect transistor device 18 is connected with its source connected to ground potential and its drain connected to the second output node 24. The first output note 22 for the first FET device 14, is connected through the resistive gate medium 20 of the second field effect transistor device 18, to the drain potential VDD. Correspondingly, the second output mode 24 is connected through the resistive material of the gate 16 for the first FET device 14, to the drain potential VDD. The conduction state of each FET device 14 and 18 is therefore made dependent upon the quantity of current flowing through the opposing device, thereby providing the cross-coupled action necessary to the operation of a flip-flop circuit.

FIG. 3a shows the plan view of the layout of the circuit shown schematically in FIG. 2, with like numbers indicating like elements. Transistor 14 is composed of source diffusion 15 connected to ground and drain diffusion 13 connected to output node 22. Resistive gate 16 lying over the channel region separating the source and drain diffusions 15 and 13 is composed of a highly resistive layer of polycrystalline silicon. The end of the resistive gate 16 lying over the diffusion 13 is not connected thereto, but is, instead, connected to the drain potential VDD. Correspondingly, the FET device 18 is formed by the source diffusion 19 which is connected to ground potential and the drain diffusion 17, which is connected to the output node 24. The resistive gate 20 is connected at one end to the output node 22 and is connected at the other end to the VDD potential, there being no connection with the diffusion 17 over which it lies. The channel region of the first FET device 14 lying between the source 15 and drain 13 and beneath the gate 16 and the channel region of the FET device 18 lying between the source 19 and the drain 17 beneath the gate 20, is ion implanted so that the threshold voltage VT is approximately one third to one half the value of VDD. The resistivity of a polycrystalline silicon material used for the gates 16 and 20 is greater than 100 kilohm per square.

FIG. 2 illustrates the current flowing through the resistive gate 16 of the FET device 14, which current continues to flow from the drain 17 to the source 19 of the second FET device 18. The resistance of the resistive gate 16 for the first FET device 14 is much greater than the channel region resistive for the second FET device 18, so that the output voltage at the output node 24 is near ground potential, representing a binary zero state. Since the threshold voltage for both FET devices is approximately one third to one half the magnitude of the drain potential VDD, only about one third to one half of the channel length for the first FET 14 is inverted and therefore it does not conduct. The output voltage at the output node 22 is thus at approximately VDD in magnitude, since no current flows through the gate resistance 20 of the second FET device 18. The second FET device 18 has its gate potential equal to VDD over the entire gate region, thereby sustaining the "on" state of FET device 18. Thus, the bistable flip-flop action is accomplished for the circuit of FIG. 2, which employs a reduced number of circuit elements and occupies a reduced layout area, when compared to prior art bistable circuits.

FIG. 3a shows the layout of the circuit of FIG. 2. The gate's width to length ratio, oxide windows, device lengths, oxide doping, or polysilicon dopings, can be made different from another, so as to achieve an asymmetrical state where the flip-flop always goes to one condition whenever VDD is brought up from zero.

FIG. 3b shows a cross-sectional view of the structure of FIG. 3a, along the section line of A—A'. N-type diffusions 15 and 17 are diffused or ion-implanted into a P-type substrate 27 composed of silicon. A layer of silicon dioxide 23 covers the surface of the silicon 27 on top of which is deposited the polycrystalline gates 16 and 20. A via hole connections 25 connects the gate 16 to the diffusion 17, which serves as the output electrode 24.

FIG. 3c shows a cross-sectional view along the section line B—B' of the structure of FIG. 3a, showing in particular the structure of the FET device. N-type diffusions 13 and 15 are diffused or ion-implanted into the silicon substrate 27 of P-type conductivity. A thick layer of silicon dioxide 23 is deposited thereover, and a thin region of silicon dioxide 29 forms the gate region for the FET device. Over the oxide layers 23 and 29 is deposited the polycrystalline silicon gate 16 with the end thereof lying over diffusion 13 being connected to drain potential VDD. The channel region 31 for the FET device is located between the source 15 and drain 13.

Figure 4B:
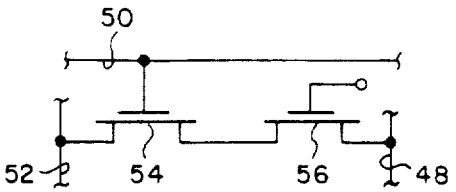
FIG. 4b is circuit schematic of an AND FET device in an alterable PLA.
Figure 4C:
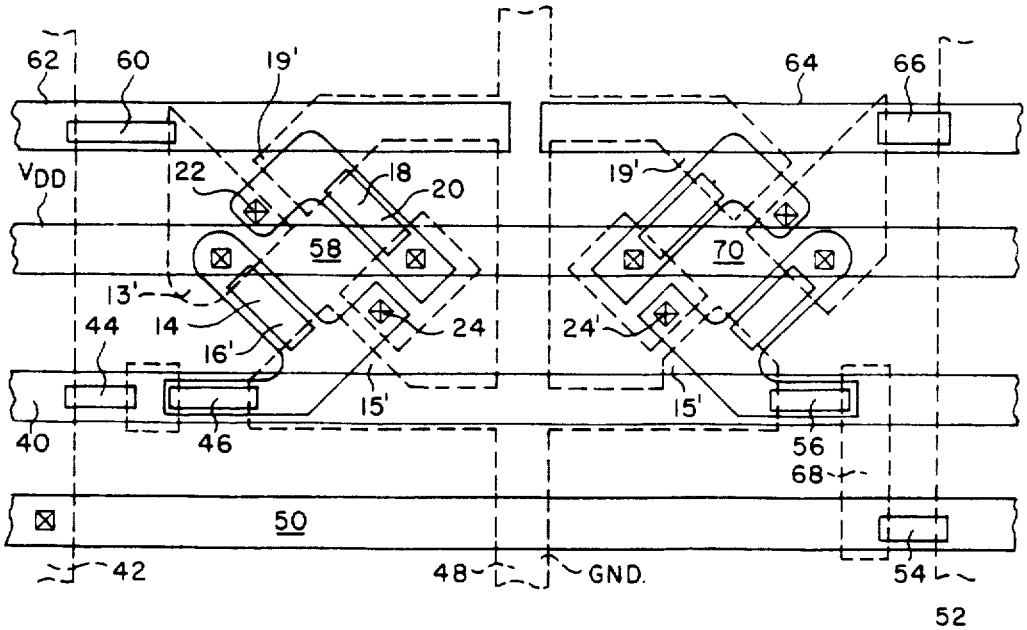
FIG. 4c is a plan view of the layout of an electrically programmable PLA employing the flip-flop with resistive gate field effect transistors.

FIGS. 4a, 4b and 4c illustrate the application of the flip-flop resistive gate FET devices to a programmable PLA. The overall layout for the PLA is the merged array PLA concept disclosed in copending U.S. patent application, Ser. No. 809,877, filed June 24, 1977 by Balasubramanian, et al. and assigned to the instant assignee. The flip-flop circuit disclosed in FIG. 3a can be introduced into the merged array region of the PLA as a circuit which stores a preset personalization and whose output is connected to the gate of an FET device in series with the AND and OR array devices. The schematic diagram shown in FIG. 4a illustrates the bit partitioning line 40 is connected to the gate of the AND array transistor 44 and the product term diffusion line 42 is connected to the source of the AND array transistor 44. The drain of the AND array transistor 44 is connected to the source of the AND array personalization transistor 46 whose drain is connected to the ground line 48. The gate of the AND array personalization transistor 46 is connected to the flip-flop which will set the personalizatoin state for the AND array personalization transistor 46.

FIG. 4b shows the product term line 50 which is connected to the gate of the gate of the OR array transistor 54 and the output diffusion line 52 which is connected to the source of the OR array transistor 54. The drain of the OR array transistor 54 is connected to the source of the OR array personalization transistor 56. The drain of the OR array personalization transistor 56 is connected to the ground line 48. The gate of the OR array personalization transistor 56 is connected to a flip-flop, that sets the personalization state of the OR array personalization transistor 56, electrically.

FIG. 4c is a plan view of the layout of an electrically programmable PLA array where the flip-flop with resistive gate FET devices is employed as the programming element 58 for the AND array device 46 and the programming element 70 for the OR array device 56. The state of the flip-flop 58 is set by the flip-flop set line 62, which will selectively connect the node 22 through the AND array set transistor 60 to the product term diffusion 42 which can be pulsed with a voltage sufficient to flip the flip-flop 58 into its desired state. The resistive gate electrode 16', which is connected to the output node 24, has an extension which serves as the gate for the AND array personalization transistor 46, such that if the output node 24 has an "on" state voltage, the gate for the transistor 46 will have substantially the same voltage, thereby rendering the AND array personalization transistor on, enabling the AND array transitor 44. If flip-flop 58 were switched off by means of the flip-flop set line 62, so that the output node 24 has an off state voltage, then the AND array personalization transistor 46 will also be off, disabling the AND array transistor 44.

Correspondingly, the flip-flop set line 64 will set the flip-flop 70 through the OR array set transistor 66 to the state determined by the voltage pulse applied to the output diffusion 52. The state of the output node 24' for the flip-flop 70 will be applied as the gate potential to the OR array personalization transistor 56, thereby enabling or disabling the operation of the OR array transistor 54. Lines 40, 50, 62, 64 and $V_{DD}$ are metal lines which occupy a level above that occupied by the resistive gate electrodes 16' and 20, which in turn is above the level occupied by diffusions 42, 48 and 52. Thus it is seen that FETs 44 and 54 are metal gate devices whereas FETS 46 and 56 are silicon gate devices.

Thus, the AND array and OR array elements 44 and 54, respectively, may be electronically programmable and repeatedly altered. The alteration is rapid at electronic speed. The PLA circuit features a very small, efficient flip-flop using the resistive gate FET flip-flop concept. PLA LSI chips built with this basic cell would have useful application for situations where large numbers of engineering changes are anticipated in the product. The device also has useful application as a hardware modeling tool for machine development.

Figure 5A:
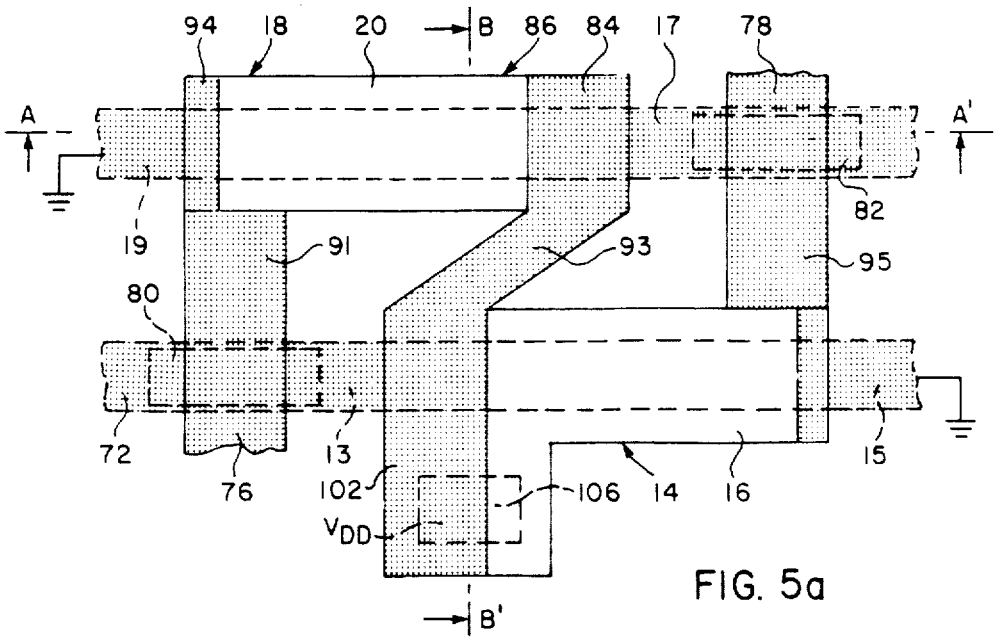
FIG. 5a shows the plan view of the layout of a flip-flop using resistive gate field effect transistors wherein the diffusions are formed by an ion implantation after the polycrystalline silicon gate regions are deposited.
Figure 5B:
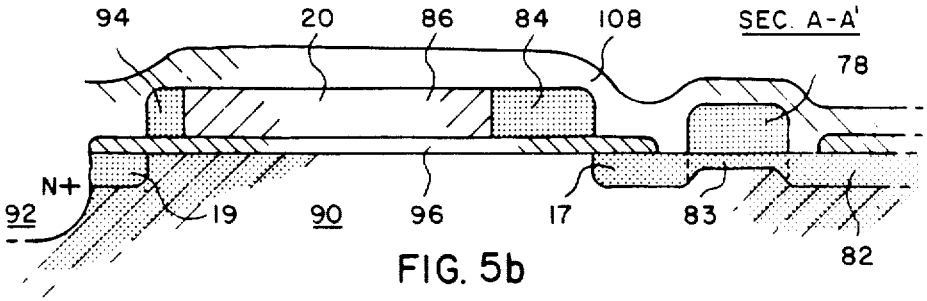
Figure 5C:
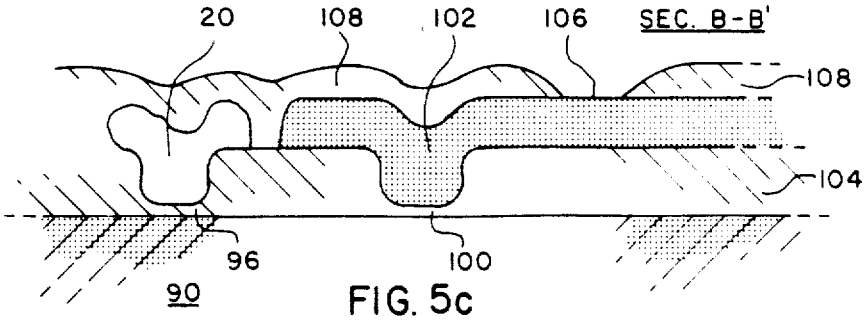

FIGS. 5a–5c show an alternate structural embodiment for the resistive gate FET flip-flop whose electric schematic is shown in FIG. 2. Like numbers correspond to like parts in FIG. 2 and FIGS. 5a–5c.

In FIG. 5a, a plan view of the layout of the flip-flop is shown using resistive gate field effect transistors wherein the diffusions are formed by an ion-implantation step after the polycrystalline silicon gate regions are deposited. The structure shown in FIGS. 5a–5c has the advantage of the more simplified fabrication technique and it is more compact than the layout of FIG. 3a.

FIG. 5a shows a plan view where the two resistive gate FET devices 14 and 18 are formed with their gate portions 16 and 20 comprising a single contiguous piece of polycrystalline silicon, selectively doped in designated regions to enhance the conductivity thereof. Structural features can be seen to better advantage in FIG. 5b which is a cross-sectional view along the line A—A'. In FIG. 5b it can be seen that a silicon substrate 90 has a thick layer of field oxide 104 grown over substantially the entire surface and a subsequent etching step removes the field oxide in the region where the resistive gate FET flip-flop is desired to be placed. A thin layer of oxide 96 is then grown on the exposed surface of the silicon substrate 90. Following this, the regions 80 and 82 are etched through the thin oxide layer 96 to permit the subsequent formation of the drawn in FIG. 7, isolated from vertical bit lines 110 and 112 by means of transfer devices 120 and 130 which are gated on by means of the horizontal word line 118.

The resistive gate flip-flop circuit of FIG. 2 is related to the resistive gate flip-flop circuit FIG. 7 in the following manner, FET device 14 in FIG. 2 corresponds to FET device 128 and FET device 18 in FIG. 2 corresponds to FET device 122 in FIG. 7. The output node 22 in FIG. 2 corresponds to the output node 26 in FIG. 7 and the output node 24 in FIG. 2 corresponds to the output node 134 in FIG. 7. The output node 126 in FIG. 7 is connected to the bit sense line 112 by means of the transfer device 130 and the output node 134 is connected to the bit sense line 110 by the transfer device 120.

Figure 7:
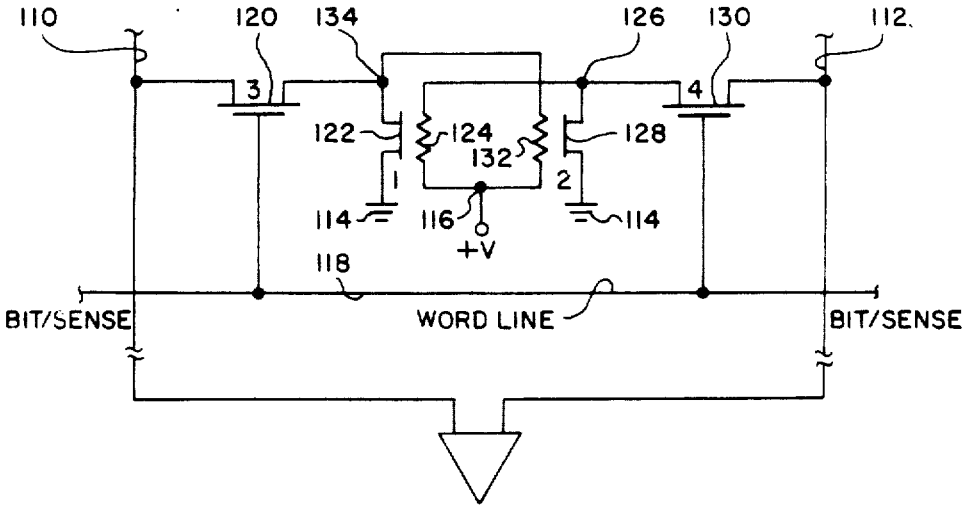
FIG. 7 is a schematic diagram of the interconnection of the elements for the random access memory cell shown in FIG. 6.

In operation, to write a bit into the flip-flop cell of FIG. 7, the work line 118 is pulsed in order to turn on the transfer devices 120 and 130 and the bit sense line 110 is lowered in voltage and the bit sense line 112 is raised in voltage, for example, thereby turning on the FET device 122 and, through the flip-flop action described for circuit of FIG. 2, turning off the FET device 128. At this time the word line 118 is reduced in voltage, thereby turning off the transfer devices 120 and 130, and thus an information bit has been written into the flip-flop storage cell. To read the information contents of the flip-flop storge cell in FIG. 7, the word line 118 is raised in voltage, thereby turning on the transfer devices 120 and 130 and connecting the respective output nodes 134 and 126 to the bit sense lines 110 and 112, respectively. The relative voltage magnitudes produced by the cell in the bit sense lines is then sensed by the differential sense amplifier.

Figure 6:
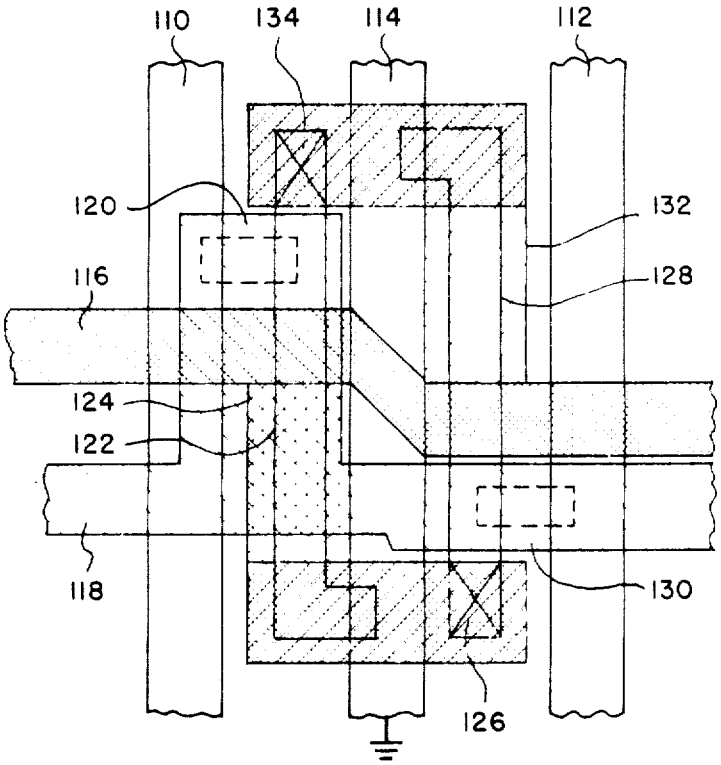
FIG. 6 is a plan view of the layout of a flip-flop using resistive gate field effect transistor devices as applied in a random access memory.

Turning now to FIG. 6 which shows the structure and layout of the RAM cells schematically illustrated in FIG. 7, the structure disclosed in FIGS. 5a–5c has been modified to apply to the random access memory topology of the circuit FIG. 7. This is done by adding two transfer FET's 120 and 130 and placing the ground diffusion 114 down the middle of the layout. In addition, the bit sense diffusions 110 and 112 are laid out in parallel to the ground diffusion 114. Finally, the word line is deposited as a metal layer 118 above the oxide layer 97. Consequently, there are three levels of interconnections, the diffusion level and the substrate 90, the polysilicon level as represented by the polysilicon layer 86, and the metal layer for the work line 118.

Figure 8:
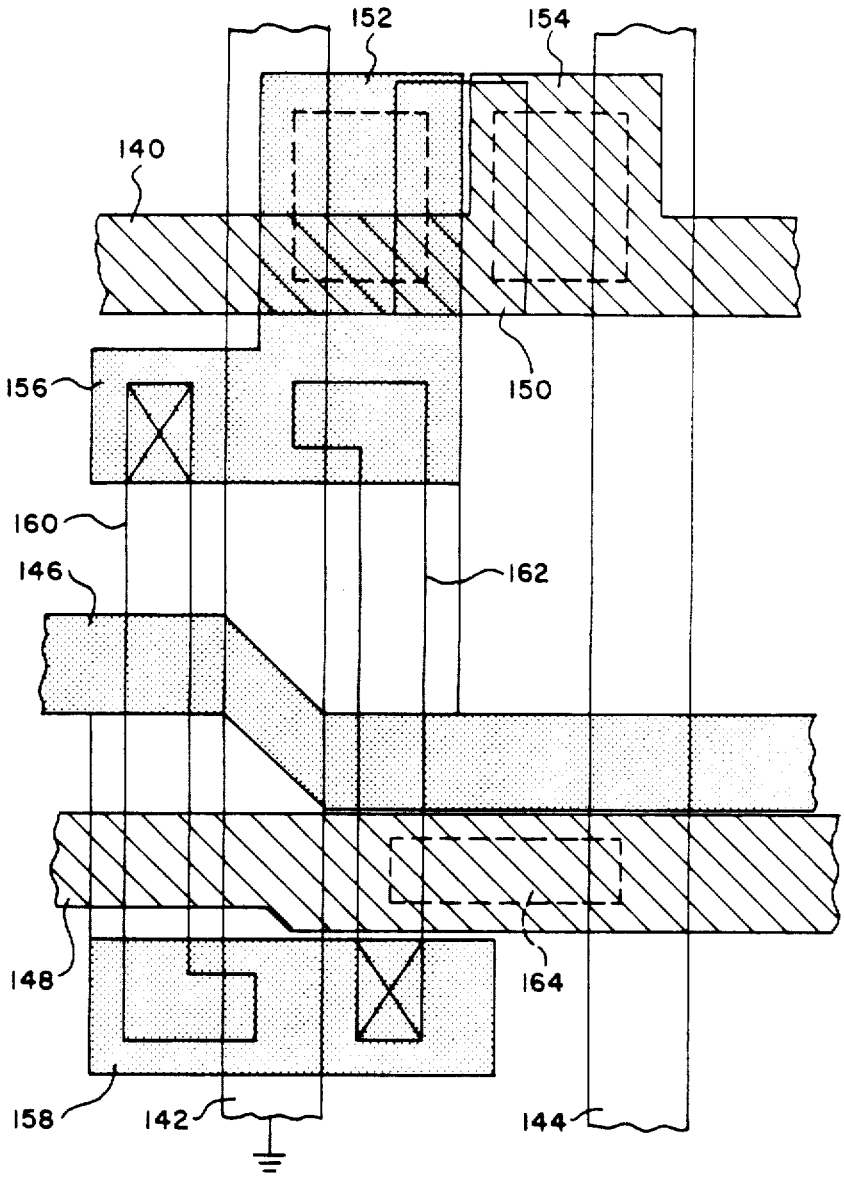
FIG. 8 is a plan view of another layout of flip-flop with resistive gate field effect transistor as employed in an electrically programmable PLA circuit.

Still an alternate application for the resistive gate FET circuit is the electrically programmable PLA as was described in the circuit schematic for the AND array element shown in FIG. 4a. The function of the resistive gate flip-flop circuit of FIG. 8 to store the state of conductivity of the gating transistor 46 shown in FIG. 4a which was labeled AP1 which corresponds to the device 152 shown in the layout of FIG. 8 Correspondingly, the product term transistor 44 labeled A1 in FIG. 4a corresponds to the similarly labeled transistor 154 in FIG. 8. The layout and structure of FIGS. 5a–5c has been adapted to the electronically programmable PLA application of FIG. 8. In particular, the FET device 14 shown as device 162 in FIG. 8 and FET device 18 shown as device 160 in FIG. 8 are constructed in a manner substantially the same as are the devices shown in FIG. 5a. The output node 78 connected to the gate of the device 14 serves as the gate 152 for the programming gate device 46 which selectively connects the AND array element 44 to the product term diffusion 42. When a pulse is output on the bit contact regions 76 and 78 to the substrate. Following this step, a layer of polycrystalline silicon 86 is formed on the surface and by photolithographic techniques, is patterned to form the layout shown in FIG. 5a defining the contact region 102, the gate 16 for the FET 14 and the contact 78, and in addition the gate 20 for the FET 18 and the contact 76.

After the structure shown in FIGS. 5a and 5b is formed on the polycrystalline silicon layer, an ion-implantation step takes place to define the high resistivity gate regions 16 and 20 for the FET devices 14 and 18, respectively and the low resistivity inter-connection portions 91, 93 and 95. In the preferred embodiment, the substrate 90 is doped p-type with a resistivity of 2 ohm-centimeters. The thickness of the thin oxide 96 is from 500 to 700 . The thickness of the polysilicon layer 86 is approximately 2 microns. The ion-implantation step is carried out with an n-type doping such as phosphorous at an acceleration energy from between 75 to 100 KeV at a dosage of approximately $10^{15}$ atoms per square centimeter. The ion-implantation step not only provides the selective increase in the conductivity of the polycrystalline silicon layer 91, 93 and 95 but also introduces the drain 13 and source 15 diffusion regions for the FET device 14 and the drain 17 and source 19 diffusion regions for the FET device 18. The ion-implanted diffusions 19 and 15 connect into the circuit ground diffusions 92 on the chip. Following the ion-implantation step, the structure is thermally oxidized at approximately 900 to 1000 degrees centigrade in a steam atmosphere which serves to grow the oxide layer 108 and in addition, serves to out-diffuse the ion-implanted phosphorous atoms in the contact regions 78 and 76 into the portion 83 of the substrate 90 directly beneath the structures. Contact 106 connects polysilicon layer 86 to $V_{DD}$.

A better view of the relationship between the thin oxide regions 96 and 100 for the FET devices 18 and 14, respectively, can be seen to better advantage in FIG. 5c which is a cross-sectional view along the section line B—B' of FIG. 5a.

It can be seen that the structure shown in FIGS. 5a–5c lends itself to more ready fabrication by the simultaneous formation of the conductive portions 94 and 84 for example in the polysilicon layer, the diffused regions 72 and 82 for example in the semiconductor substrate 90, the conductive portion of the contacts 78 and 76, for example, and the interconnection of the circuit by virtue of the ion-implanted diffusion 19 to the balance of the ground net, through the ion-implantation step and subsequent heating cycle described. The layout is a more compact layout than is that shown in FIG. 3a, because of the self-aligned feature of the structure where the drain diffusion 17 and source diffusion 19 for the FET device 18 is aligned with respect to the edge of the gate region 20, for example. This reduces the photolithographic tolerances which are inherent in the fabrication where more than one mask would be needed.

Turning now to FIG. 6, there is shown a layout of the random access memory cell which takes the basic polycrystalline silicon layout shown in FIG. 5a and applies it to the random access memory circuit application shown in FIG. 7. The numbered elements in FIG. 6 correspond to the numbered elements in FIG. 7.

As is shown in FIG. 7, the random access memory is organized into vertical columns and horizontal rows of storage cells, each cell comprising the resistive gate flip-flop shown schematically in FIG. 2 and now repartitioning line 40, the product termed diffusion 42 will be connected to the ground diffusion 48 through the AND array element 44 only if the programming gate 46 is conductive and that state of conductivity is determined by the storage state of the resistive gate flip-flop cell composed of devices 14 and 18.

Some of the advantages of the resistive gate flip-flop cell in its layout shown in FIGS. 5a–5c for applications such as the RAM cell of FIGS. 6 and 7 and the electrically programmable PLA of FIG. 8 can be itemized as follows. The significant advantage is that the resistive gate FET structure can be added to existing metal gate FET processes. For example, when the conventional metal gate FET process is completed through the source/drain deposition and reoxidation, then windows are opened for the gate and contact regions for the flip-flop region as was described with respect to FIGS. 5a–5c. After the structure has been formed as was described for FIGS. 5a–5c, the conventional FET metal gate process can be continued. This results in the incorporation of an electrically programmable storage element in random access memory arrays and PLA arrays which have metal gate array elements. Indeed any logic circuit employing either metal gate or polycrystalline silicon gate FET devices can have resistive gate flip-flop circuits distributed throughout their network.

While the invention has been particularly shown and described with reference to the preferred embodiments thereof, it will be understood by those skilled in the art that the foregoing and other changes in form and detail may be made therein without departing from the spirit and scope of the invention.

I claim:

1. A flip-flop circuit, comprising:

a first FET device having its source connected to a first potential;

a second FET device having its source connected to said first potential;

said first FET device having a gate electrode composed of a resistive material with a first side connected to the drain of said second FET device and a second side connected to a second potential;

said second FET device having a gate electrode composed of a resistive material with a first side connected to the drain of said first FET device and a second side connected to said second potential;

whereby a compact flip-flop circuit is formed.

2. The circuit of claim 1, wherein said resistive material for said gate electrodes of said first and second FET devices is polycrystalline silicon.

3. The flip-flop circuit of claim 1, wherein said gate of said first FET device has a different resistance between said first and second sides than that for said second FET device;

whereby the flip-flop will assume a predetermined state when said first and second potentials are turned on.

4. The circuit of claim 3, wherein said resistive material for said gate electrodes of said first and second FET devices is polycrystalline silicon.

5. The circuit of claim 4 wherein said different resistance between said first and second gates is due to a difference in concentration of conductivity enhancing dopants therein.

6. The circuit of claim 4, wherein said different resistances are due to a difference in the mechanical dimensions of said gates.

7. A programmable PLA circuit connected between a bit partitioning input line, a product term line, a ground line and a programming line, comprising:

a first and second FET device connected in series between said product term line and said ground line, with the gate of said first FET device connected to said bit partitioning input line, forming a read only memory element;

a third FET device having its source connected to said product term line and its gate connected to said programming line;

a fourth FET device having its source connected to a first potential and its drain connected to the drain of said third FET device;

a fifth FET device having its source connected to said first potential and its drain connected to the gate of said second FET device;

said fourth FET device having a gate electrode composed of a resistive material with a first side connected to the drain of said fifth FET device and a second side connected to a second potential;

said first FET device having a gate electrode composed of a resistive material with a first side connected to the drain of said fourth FET device and a second side connected to said second potential;

whereby the conduction state of said second FET device is controlled by the flip-flop circuit formed by said fourth and fifth FET devices, whose state is set through said third FET device, thereby blocking conduction through said first FET device.

8. The circuit of claim 7, wherein said resistive material for said gate electrodes of said fourth and fifth devices is polycrystalline silicon.

9. A random access memory element connected between a first and second bit/sense lines and a word line, comprising:

a first FET isolation device having its source connected to said first bit/sense line and its gate connected to said word line;

a second FET isolation device having its source connected to said second bit/sense line and its gate connected to said word line;

a first FET storage device having its source connected to a first potential and its drain connected to the drain of said first FET isolation device;

a second FET storage device having its source connected to said first potential and its drain connected to the drain of said second FET isolation device;

said FET storage device having a gate electrode composed of a resistive material with a first side connected to the drain of said second FET storage device and a second side connected to a second potential;

said second FET storage device having a gate electrode composed of a resistive material with a first side connected to the drain of said first FET storage device and a second side connected to said second potential;

whereby a compact random access memory array is formed.

10. The memory element of claim 9, wherein said resistive material for said gate electrodes of said first and second FET storage devices is polycrystalline silicon.

*11. A binary switching circuit, comprising:*

*an insulated gate field effect transistor device having its source/drain path connected between a first binary potential and an output node and having a gate electrode;*

*a load device connected between said output node and a second binary potential;*

*said gate electrode composed of a resistive material having a first side connected to said second binary potential and a second side connected to a binary signal source selectively inputting either said first binary potential or said second binary potential thereto;*

*said first binary potential applied to said second side causing a current to flow through said resistive material reducing the potential of portions of said resistive material between said first and second sides to be a magnitude between said first and said second binary potentials, thereby reducing the conductivity of said source/drain path resulting in a first output signal potential at said output node;*

*said second binary potential applied to said second side causing substantially no current to flow through said resistive material, maintaining the potential of said gate at said second binary potential, thereby increasing the conductivity of said source/drain path resulting in a second output potential at said output node;*

*whereby said binary signals applied to said second side of said gate produce a binary output signal at said output node.*

* * * * *

UNITED STATES PATENT AND TRADEMARK OFFICE

CERTIFICATE OF CORRECTION

PATENT NO. : RE 32,071

DATED : January 21, 1986

INVENTOR(S) : Claude L. Bertin

It is certified that error appears in the above-identified patent and that said Letters Patent is hereby corrected as shown below:

Column 9, Line 30, Claim 7, "first" should read --fifth--.

Signed and Sealed this

*Eighth* Day of *April 1986*

[SEAL]

*Attest:*

DONALD J. QUIGG

*Attesting Officer*

*Commissioner of Patents and Trademarks*